United States Patent [19]

Kemlage

[11] 4,239,811

[45] Dec. 16, 1980

[54] LOW PRESSURE CHEMICAL VAPOR DEPOSITION OF SILICON DIOXIDE WITH OXYGEN ENHANCEMENT OF THE CHLOROSILANE-NITROUS OXIDE REACTION

[75] Inventor: Bernard M. Kemlage, Kingston, N.Y.

[73] Assignee: International Business Machines Corporation, Armonk, N.Y.

[21] Appl. No.: 66,965

[22] Filed: Aug. 16, 1979

[51] Int. Cl.$^3$ .............................................. C23C 11/00
[52] U.S. Cl. ..................................... 427/95; 427/255; 427/255.3
[58] Field of Search ................... 427/95, 248 C, 255, 427/255.3

[56] References Cited

U.S. PATENT DOCUMENTS

| B 554,164 | 3/1976 | Graul et al. | 427/95X |
|---|---|---|---|
| 3,331,716 | 7/1967 | Bloem et al. | 427/93 X |
| 3,887,726 | 6/1975 | Bratter et al. | 427/95 |
| 4,002,512 | 1/1977 | Lim | 350/96.12 X |

OTHER PUBLICATIONS

Rosler, R. S., "Low Pressure CVD Production Processes for Poly, Nitride, and Oxide", Solid State Technology, Apr. 1977, pp. 63–70.

*Primary Examiner*—Evan K. Lawrence
*Attorney, Agent, or Firm*—George O. Saile

[57] ABSTRACT

A method is described for forming a silicon dioxide layer on a semiconductor substrate in a furnace heated reaction zone of a chemical vapor deposition reactor having an input end for gaseous reactants wherein the silicon dioxide layer is not subject to degradation during subsequent oxidation cycles. A gaseous chlorosilane is mixed with nitrous oxide gas in the reactor. Oxygen gas is added, between about 0.25% to 10% by volume of total reactive gas mixture, to the chlorosilane and nitrous oxide gases in the reaction zone where the temperature is between about 800° C. to 1200° C. in a pressure of less than about 5 torr to deposit the silicon dioxide layer onto the substrate.

10 Claims, 6 Drawing Figures

LOW PRESSURE CHEMICAL VAPOR DEPOSITION OF SILICON DIOXIDE WITH OXYGEN ENHANCEMENT OF THE CHLOROSILANE-NITROUS OXIDE REACTION

CROSS REFERENCE TO RELATED APPLICATION

B. M. Kemlage patent application, Ser. No. 066,964 filed Aug. 16, 1979, simultaneoulsy with this patent application and entitled "Prevention of Low Pressure Chemical Vapor Deposition Silicon Dioxide Undercutting and Flaking."

BACKGROUND OF THE INVENTION

1. Field of the Invention

This invention relates to methods of forming silicon dioxide and more particularly to a low pressure chemical vapor deposition method involving the reaction of a chlorosilane with a nitrous oxide to form chemically deposited silicon dioxide.

2. Description of the Prior Art

Silicon dioxide is widely used as an insulator and/or masking layer in the formation of semiconductor and integrated circuit devices. An important method for forming silicon dioxide is by the thermal growth method involving the thermal oxidation of silicon in the presence of oxygen or steam at relatively high temperatures above 900° C. and usually 1000° C. or more. The method is a high temperature technique which could cause a shift in the P-N junction boundary during the oxidation process. A further problem is that the method is only suitable when the silicon dioxide is to be grown on silicon. A further method for growing a silicon dioxide layer involves the use of a chemical vapor deposit reaction involving the gaseous oxidation of silicon tetrachloride, silane, dichlorosilane, or the like. This method has been used for many years at atmospheric pressure and more recently at low pressures of the order of less than 1 torr.

The atmospheric pressure method of chemical vapor deposition of silicon dioxide from a gaseous oxidation of silicon tetrachloride or silane has generally involved undesirably high temperatures such as between 900° to 1200° C. These temperatures would result in the problem of a shift of P-N junction boundaries which is undesirable. Low temperatures below 900° C., gaseous oxidation of silane or silicon tetrachloride have resulted in poorer quality silicon dioxide films than the thermally grown silicon dioxide films. The M. J. Lim U.S. Pat. No. 4,002,512, entitled "Method of Forming Silicon Dioxide", dated Jan. 11, 1977, teaches a low temperature method for forming silicon dioxide films of high quality which utilizes dichlorosilane which is oxidized using an oxidizing gas such as $O_2$, $CO_2$, $N_2O$, $H_2O$, etc., combined with an inert carrier gas such as He, A, $N_2$, $H_2$, etc.

The use of a low pressure hot wall system for the chemical vapor deposition of silicon dioxide is described by J. Sandor presented at Electro-Chemical Society Meeting, Los Angeles, California, May 6–10, 1962, and by J. Oroshnik, et al, in Journal Electro-Chemical Society Solid State Science, Vol. 115, gate 649, 1968, and by R. S. Rosler, entitled "Low Pressure CVD Production Processes for Poly, Nitride, and Oxide", in Solid State Technology, Apr. 1977, pp. 63–70. The R. S. Rosler paper is a survey paper of the various low pressure chemical vapor deposited methods for forming polycrystalline silicon, silicon nitride and silicon dioxide films in the semiconductor industry. On page 68, Rosler describes the low pressure reactions of dichlorosilane and nitrous oxide in a temperature range of 800° C. to 920° C.

The gaseous reaction of chlorosilanes, and more particularly dichlorosilane, with nitrous oxide has been found to produce silicon dioxide layers which were of high quality in their refractive index, but were susceptible to degradation during subsequent oxidation cycles greater than about 900° C. The phenomena of degradation is believed to be an undercutting phenomenon which result in flasking of the silicon dioxide layer that has been undercut. The resulting structures of this problem are as shown in FIGS. 1 and 2. FIG. 3 is a non-undercut plan view of a silicon dioxide layer formed by the present process.

SUMMARY OF THE INVENTION

In accordance with the present invention, this degradation problem is overcome by the addition of oxygen to the gaseous chlorosilane and nitrous oxide reaction. The gaseous chlorosilane is mixed with nitrous oxide in the reactor tube wherein the low pressure chemical vapor deposition of silicon dioxide is to occur. Gaseous oxygen is added for example, upstream of the reaction zone, to the mixture of chlorosilane and nitrous oxide. In the reaction zone of the chemical vapor deposition reactor, the reaction temperature is between about 800° C. to 1200° C. The resulting silicon dioxide layer has been found not to degrade in subsequent oxidation cycles.

DETAILED DESCRIPTION

The low pressure chemical vapor deposited silicon dioxide, $SiO_2$, layers by the gas phase reaction of chlorosilanes, particularly dichlorosilane, and nitrous oxide, was undercut by a 1050° C. hydrogen chloride-dry oxidation cycle. This undercutting phenomena proceeds far enough that actual flaking of the $SiO_2$ layer occurs. The characterstics of the as-deposited $SiO_2$ films appear excellent. The surfaces are planar and featureless, the refractive index is 1.456 and a I.R. Spectrophotometer analysis produces a graph identical of that of otherwise formed high quality $SiO_2$ layers. The etch rate in 5:1 buffered hydrofluoric acid is slightly less than other high quality chemical vapor deposited $SiO_2$ layers and no chemical attack is observed in pyrocatechol solution when it is used as a mask. The pin hole density has been measured by metal capacitor oxide breakdown to be zero.

The as-deposited films were placed in Argon annealing furnaces at 1000° C. for 30 minutes and 1100° C. for 60 minutes. The annealing had no apparent effect on any of the film characterstics. The surfaces remained featureless and the thickness and refractive index were unchanged leading one to assume that the $SiO_2$ is deposited in a densified state. The same is true for hydrogen annealing at 1150° C. for 30 minutes.

Figure 4:
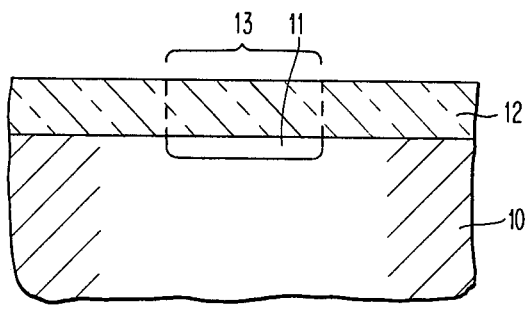
FIG. 4 is a schematic cross-section that shows the undercutting phenomena.

The $SiO_2$ layer was found to react in the presence of hydrogen chloride, $H_2O$ and $O_2$ at high temperatures. The reaction ranges from dense mound formation to flaking films. FIG. 4 illustrates the undercut phenomenon wherein the silicon substrate 10 is attacked to form an opening 11 at the silicon dioxide layer 12 to silicon substrate interface. The portion 13 of the silicon dioxide layer can break away above the opening 11. The undercutting phenomena occurs for 2% hydrogen chloride-$O_2$ oxidations performed at 1050° C., but it does not occur at 850° C. Dry $O_2$ oxidations at 1100° C. form dense mounds in the films after 60 minutes with no increase in density after 220 minutes. The same dense mound formation occurs for wet oxidations at 1000° C. Increasing the wet oxidation temperature to 1100° C. results in complete undercutting. This latter condition of an 1100° C. dry-wet-dry (5 minutes-10 minutes-5 minutes) oxidation cycle was utilized as the undercutting test criteria for films deposited under various conditions.

Films which were annealed in Argon at 1100° C. for 60 minutes, oxygen at 1100° C. for 220 minutes, or hydrogen at 1150° C. for 30 minutes, were tested. These processes produced no observable benefit. Process parameters which have been tested include growth rate (25 Å/min to 220 Å/min), $N_2O:SiH_2Cl_2$ ratios (10:1 to 3:1), system pressure (300 mtorr to 800 mtorr) and temperatures (890° C. to 940° C.). Of these only temperature has an effect on the results. It has been determined that the problem becomes more thickness sensitive for depositions performed at lower temperatures. For thicknesses less than 1500 Å a bubble formation occurs. From about 1500 Å to about 2500 Å these bubbles increase in density to form plates which appear oriented to the substrate. For thicknesses greater than 2500 Å the undercutting and flaking phenomena is observed. Using a scanning Electron Microscope, it was determined that the mounds and plates were probably due to a chemical attack of the silicon substrate. The mounds and plates are shallow etch pits in the silicon substrate.

The problem is believed to be caused by the inclusion of chlorine in the deposited $SiO_2$ film. This bonded chlorine may occur due to incomplete oxidation of the chlorosilane, such as dichlorosilane $SiH_2Cl_2$, probably in the form of $SiO_xCl_y$. A physical analysis of the deposited $SiO_2$ films by Auger and Raman spectroscopy confirmed the presence of chlorine.

A clear indication of chlorine was seen at the $SiO_2/Si$ interface, but an exact determination of concentration could not be achieved by the Auger method. Raman spectroscopy, on the other hand, defined a chlorine inclusion of approximately 2.7% throughout the as-deposited $SiO_2$ layer thickness in tested samples.

Attempts were made to change the reaction chemistry to remove the presence of chlorine. Hydrogen was introduced in order to promote the production of hydrogen chloride, thereby cracking the Si-Cl bond. Flows of up to 5 l/minute, however, had no influence on the degradation results. Oxygen was then tried at a flow rate of 100 cc/minute. The resultant films were hazy, non-uniform in thickness and had a refractive index of 1.33. Reoxidation, however, showed no tendency to undercut and the refractive index increased to 1.445. A substantial gas phase reaction had occurred during deposition. Reducing the $O_2$ flow to 25 cc/minute increased the refractive index of the as-deposited film to 1.408 which densified to 1.454. Further reduction in $O_2$ flow rate produced clear films with only a slight variation in thickness uniformity and which had no tendency to undercut the silicon substrate. The effective $O_2$ range for producing stable $SiO_2$ in a densified state is from about 0.25% to 10%. Above 10% the $O_2$ input severely degrades the thickness uniformity and growth rate of the $SiO_2$.

The optimum oxygen input based on refractive index, chlorine content, and thickness uniformity is 0.25%–2.5%. The optimum temperatures for inputting oxygen into the chemical vapor deposition reactor are 500° C.–1000° C. This range minimizes the gas phase reaction of chlorosilane and $O_2$.

Operable reaction temperatures for $SiO_2$ depositions from $SiH_2Cl_2$ are 800°–1050° C.; $SiH_1Cl_3$ are 900°–1100° C.; and $SiCl_4$ are 950°–1200° C. Nitrous oxide does not dissociate readily below 800° C. at low pressures, therefore, the reaction temperatures all are required to be above that temperature.

The use of the oxygen enhancement of the low pressure chlorosilane and nitrous oxide process, allows quality silicon dioxide layers to be deposited from 1000 to 100,000 Angstroms in thickness. The growth rate is between 25 and 500 Angstroms per minute. The process can be used to deposit silicon dioxide upon a flat surface or to fill grooves or openings in a body such as a silicon semiconductor substrate. The filled grooves in a silicon semiconductor body can act as dielectric isolation between pockets of monocrystalline silicon therein.

The following examples are included merely to aid in the understanding of the invention and variations may be made by one skilled in the art without departing from the spirit and scope of the invention.

EXAMPLE 1

Figure 5:
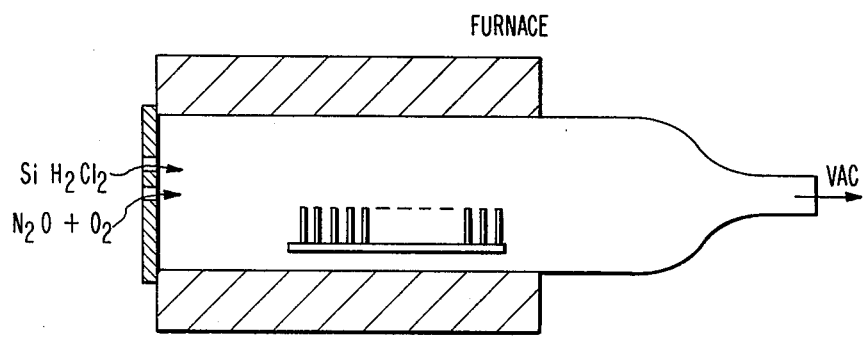

Oxygen was inputted into the nitrous oxide, $N_2O$, feed lines of the silicon dioxide chemical vapor deposition furnace shown in FIG. 5, at rates of 1, 5, 10, 15, 25, 100 cc/minute in separate runs. The oxygen and nitrous oxide were inputted upstream of the reaction zone. All other run conditions remained as follows:

$SiH_2Cl_2$ = 70 cc/min.
$H_2O$ = 300 cc/min.
reaction temp. = approx. 920° C.
inlet temp. = 600° C.
pressure = 730 mtorr.

| $O_2$ Input | $O_2$% by Volume of Total Reactive Gas Mixture $N_2O$, $O_2$, $SiH_2Cl_2$ | Refractive Index | $SiO_2$ Appearance |
| --- | --- | --- | --- |
| 1cc/min | 0.27 | 1.459 | No undercutting-No haze |
| 5cc/min | 1.3 | 1.452 | No undercutting-No haze |
| 10cc/min | 2.65 | 1.45 | No undercutting-No haze |
| 15cc/min | 3.9 | 1.435 | No undercutting-Haze |
| 25cc/min | 6.3 | 1.403 | No undercutting-Haze |
| 100cc/min | 21.5 | 1.33 | No undercutting- |

| | O₂% by Volume of Total Reactive Gas Mixture N₂O, O₂, SiH₂Cl₂ | Refractive Index | SiO₂ Appearance |
|---|---|---|---|
| O₂Input | | | Haze |

The undercutting was determined through the use of an 1100° C. steam anneal for 10 minutes. This anneal tends to densify the deposited layers which contain haze due to a gas phase reaction which produces SiO₂ particles which cause the haze as indicated by increased refractive index by densification. The SiO₂ having a refractive index of 1.33 has many voids due to presence of these discrete SiO₂ particles.

EXAMPLE 2

Figure 6:
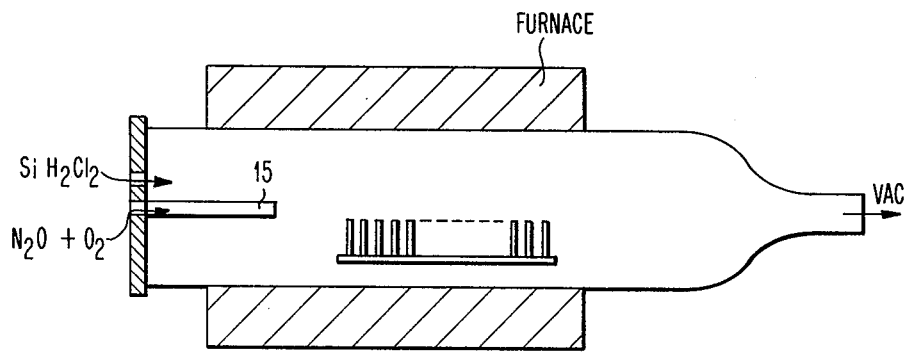
FIGS. 5 and 6 schematically illustrate the gaseous inputs to furnace heated chemical vapor deposition reactors according to the present invention.

Oxygen was inputted into the N₂O feed lines of the silicon dioxide chemical vapor deposition furnace shown in FIG. 6, at rates of 5, 15, 25, 35, and 45 cc/minute in separate runs. Two series were run. The first series introduced the N₂O/O₂ mixture at the front end of the reactor where the wall temperature is approximately 200° C. The second series introduced the N₂O/O₂ mixture in the front zone through an injection tube 15 where the temperature is about 850° C. All other run conditions remained standard as given in Example 1.

Series 1

| O₂Input | O₂% by Volume of Total Reactive Gas Mixture N₂O O₂,SiH₂Cl₂ | Comments | SiO₂ Appearance |
|---|---|---|---|
| 5cc/min | 1.3 | Undercutting | No Haze |
| 15cc/min | 3.9 | Undercutting | Haze |
| 25cc/min | 6.3 | Undercutting | Haze |
| 35cc/min | 8.6 | Undercutting | Haze |
| 45cc/min | 10.8 | Undercutting | Haze |

Series 2

| O₂Input | O₂% by Volume of Total Reactive Gas Mixture N₂O, O₂,SiH₂Cl₂ | Comments | SiO₂ Appearance |
|---|---|---|---|
| 5cc/min | 1.3 | Undercutting | No Haze |
| 15cc/min | 3.9 | Moderate Undercutting | No Haze |
| 25cc/min | 6.3 | No Undercutting | No Haze |
| 35cc/min | 8.6 | No Undercutting | No Haze |
| 45cc/min | 10.8 | No Undercutting | No Haze |

Figure 1:
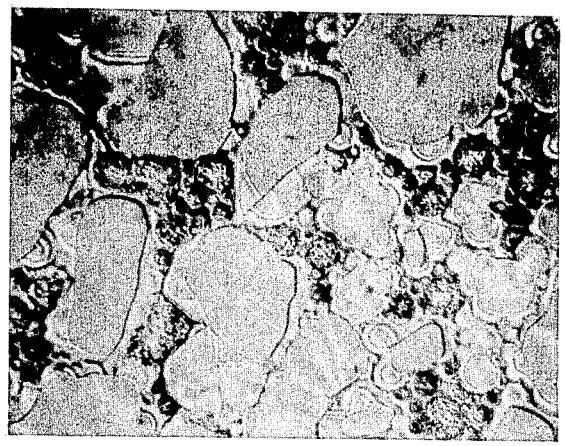
FIGS. 1 and 2 are photographs at 216× magnification of degraded low pressure chemical vapor deposited silicon dioxide films.
Figure 2:
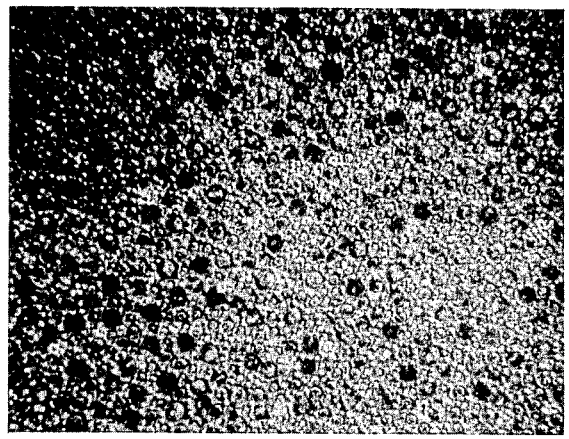
Figure 3:
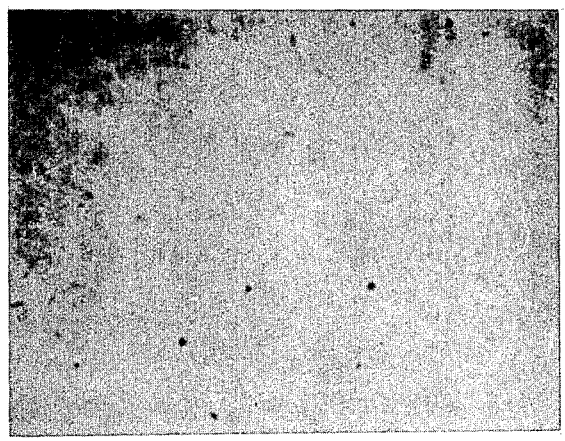
FIG. 3 is a photograph at 216× magnification of a silicon dioxide film which has not been degraded and which was made according to the method of the present invention.

FIG. 1 is a photograph magnified at 216 times of the 1.3%O₂ run SiO₂ film. FIG. 2 is a photograph magnified at 216 times of the 3.9%O₂ run SiO₂ film. FIG. 3 is a photogtaphic of the 8.6%O₂ run SiO₂ film. Imputting the N₂O/O₂ mixture at high temperature has a definite beneficial effect in reducing the gas phase reaction of SiH₂Cl₂ and O₂ such that a hazy deposit is eliminated. This injection also improves the effectiveness of reducing the chlorine content in the as-deposited films such that the undercutting phenomena is eliminated at greater than 4% O₂ by volume of the total reactive gas mixture.

Example 1 was carried out in a shorter reactor tube, as shown in FIG. 5, so that the SiH₂Cl₂/N₂O/O₂ mixture was never exposed to a temperature of less than approximately 600° C. Under these conditions even less O₂ is apparently required to complete the removal of chlorine from the deposit.

While the invention has been particularly described with reference to the preferred embodiments thereof, it would be understood by those skilled in the art that the foregoing and other changes in form and details may be made therein without departing from the spirit and scope of the invention.

Having thus described my invention, what I claim as new, and desire to secure by Letters Patent is:

1. A method for forming a silicon dioxide layer on a semiconductor substrate in a furnace heated reaction zone of a chemical vapor deposition reactor having an input end for gaseous reactants wherein the said layer is not subject to degradation during subsequent oxidation cycles comprising:
   mixing a gaseous chlorosilane with nitrous oxide gas in the reactor; and
   adding oxygen gas between about 0.25% to 10% by volume of total reactive gas mixture to said chlorosilane and nitrous oxide gases in the said reaction zone where the temperature is between about 800° C. to 1200° C. in a pressure of less than about 5 torr to deposit said silicon dioxide layer onto said substrate.

2. The method of claim 1 wherein the said chlorosilane is dichlorosilane.

3. The method of claim 2 wherein the said temperature in the reaction zone is between 850° C. to 1000° C.

4. The method of claim 1 wherein the highest temperature of said oxidation cycles is greater than about 900° C.

5. The method of claim 1 wherein the substrate is silicon.

6. The method of claim 5 wherein there are grooves in said silicon which are filled with said silicon dioxide.

7. The method of claim 6 wherein said silicon dioxide layer is formed at a growth rate between about 25 to 500 Angstroms per minute.

8. The method of claim 1 wherein the said input end of said chemical vapor deposition reactor is fully within the said furnace of said reactor and is upstream of the reaction zone, and the temperature at the said input end is above about 500° C.

9. The method of claim 1 wherein the end of said chemical vapor deposition reactor upstream of the reaction zone is outside of the said furnace of said reactor.

10. The method of claim 9 wherein the said oxygen and nitrous oxide gases are added to the said chlorosilane in the said reactor where said input end is the end of an injection tube where the temperature is above about 500° C.

* * * * *